(12) United States Patent
Ishii

(10) Patent No.: US 6,529,030 B1
(45) Date of Patent: Mar. 4, 2003

(54) IC TESTING APPARATUS

(75) Inventor: Shigeki Ishii, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/567,808

(22) Filed: May 9, 2000

(30) Foreign Application Priority Data

May 28, 1999 (JP) .......................................... 11-150231

(51) Int. Cl.[7] ........................ G01R 31/28; G01R 31/26; G01R 31/02
(52) U.S. Cl. ...................... 324/765; 324/73.1; 324/763; 714/732
(58) Field of Search ................................ 324/763, 765, 324/76.12, 76.13, 158.1, 754, 73.1; 714/732

(56) References Cited

U.S. PATENT DOCUMENTS

| | | | | |
|---|---|---|---|---|
| 4,504,783 A | * | 3/1985 | Zasio et al. ................. | 324/73 R |
| 4,754,215 A | * | 6/1988 | Kawai ........................ | 324/73.1 |
| 5,886,536 A | * | 3/1999 | Tsuruki ...................... | 324/765 |
| 6,118,294 A | * | 11/2000 | Umeda ........................ | 324/765 |

* cited by examiner

*Primary Examiner*—Kamand Cuneo
*Assistant Examiner*—Paresh Patel
(74) *Attorney, Agent, or Firm*—Fish & Richardson P.C.

(57) ABSTRACT

In a circuit 10 of an IC testing apparatus 1 in which a wave-form of a pattern signal 2*a* outputted from a pattern generator 2 is shaped and timing of the pattern signal is adjusted so that a testing signal 10*a* is created and a device 3 to be tested is made to carry out a predetermined processing according to the testing signal 10*a* and the quality of the device 3 to be tested is judged by comparing an obtained output signal 3*a* with an expecting processing result, the pattern signal 2*a* is outputted from AND gate 111 to TG/FC circuit 12 in Write Mode, and DEN control signal 101*a* is outputted from AND gate 113 to TG/FC circuit 12 by inverting Write/Read change-over signal 2*b* by an inverter 112 in Read Mode.

4 Claims, 6 Drawing Sheets

FIG. 3

| DEN CONTROL SIGNAL 101a | WRITE/READ CHANGE-OVER SIGNAL 2b | PATTERN SIGNAL 2a | TESTING SIGNAL 10a |
|---|---|---|---|
| Lo | WRITE | Lo | Lo |
| Lo | WRITE | Hi | Hi |
| Lo | READ | Lo | Lo |
| Lo | READ | Hi | Lo |
| Hi | WRITE | Lo | Lo |
| Hi | WRITE | Hi | Hi |
| Hi | READ | Lo | Hi |
| Hi | READ | Hi | Hi |

FIG. 6
PRIOR ART

| DENH SIGNAL 27a DENL SIGNAL 28a | WRITE/READ CHANGE-OVER SIGNAL 2b | PATTERN SIGNAL 2a | TESTING SIGNAL 20a |
|---|---|---|---|
| Lo | WRITE | Lo | Lo |
| Lo | WRITE | Hi | Hi |
| Lo | READ | Lo | HiZ |
| Lo | READ | Hi | HiZ |
| Hi | WRITE | Lo | Lo |
| Hi | WRITE | Hi | Hi |
| Hi | READ | Lo | Hi OR Lo |
| Hi | READ | Hi | Hi OR Lo |

IC TESTING APPARATUS

BACKGROUND OF THE INVENTION

The present invention relates to an IC testing apparatus in which a testing signal is inputted into a semiconductor device so that processing is carried out by the semiconductor device and the quality of the semiconductor device is judged by the result of processing. Also, the present invention relates to an IC testing method.

Conventionally, there is provided an IC testing apparatus for testing a semiconductor device having a correction circuit by which the wave-form of a signal inputted into the device to be tested is shaped and timing of the signal is corrected. Referring to FIGS. 4 to 6, the conventional IC testing apparatus having the correction circuit will be explained below.

FIG. 4 is an overall arrangement view showing an IC testing apparatus 100 which is an example of the conventional IC testing apparatus.

As shown in FIG. 4, the IC testing apparatus 100 includes: a pattern generator 2 for outputting a pattern signal 2a to test a device 3 to be tested; a circuit 20 for generating a testing signal 20a according to the pattern signal 2a outputted from the pattern generator 2; an analog comparator 4 for comparing an output signal 3a, which has been obtained by the operation of the device 3 to be tested according to the testing signal 20a, with a reference voltage inputted from the outside; a digital comparator 5 for comparing a result of the comparison conducted by the analog comparator 4 with an expecting pattern which is an expecting result of the test; and a timing generator 6 for generating a timing signal to control the operation of the digital comparator 5.

In this connection, in the device 3 to be tested of this IC testing apparatus 100, the testing signal 20a is inputted into a predetermined pin, and the output signal 3a is outputted from the same pin. While the device 3 to be tested is being tested, a state in which the testing signal 20a is inputted into the device 3 to be tested and written in the device 3 is defined as "Write Mode", and a state in which the output signal 3a is read out from the device 3 to be tested and outputted from the device 3 is defined as "Read Mode".

The change-over between Write Mode and Read Mode is conducted by Write/Read change-over signal 2b outputted from the pattern generator 2.

While Write/Read change-over signal 2b is showing Write Mode, the test pattern is outputted from the pattern generator 2 as the pattern signal 2a, and the circuit 20 creates the testing signal 20a according to this pattern signal 2a. This testing signal 20a is inputted into the device 3 to be tested, and the device 3 to be tested carries out a predetermined processing according to the testing signal 20a.

After the device 3 to be tested has carried out the predetermined processing according to the testing signal 20a, Write/Read change-over signal 2b is changed over to Read Mode.

While Write/Read change-over signal 2b is showing Read Mode, an expecting pattern to expect the result of processing of the device 3 to be tested is outputted as the pattern signal 2a and inputted into the digital comparator 5. The output signal 3a is outputted from the device 3 to be tested into the analog comparator 4.

On the other hand, a reference voltage of "Hi" level is inputted into VOH input terminal 41 of the analog comparator 4, and a reference voltage of "Lo" level is inputted into VOL input terminal 42 of the analog comparator 4. The analog comparator 4 compares the signal level of the output signal 3a, which has been inputted from the device 3 to be tested, with the reference voltages of "Hi" and "Lo" levels.

The digital comparator 5 operates according to the timing signal generated by the timing generator 6 and compares the signal inputted from the analog comparator 4 with the expecting pattern inputted as the pattern signal 2a, so that the digital comparator 5 judges the quality of the device 3 to be tested.

Further, IC testing apparatus 100 includes TG/FC circuit 21, which is arranged in the circuit 20. TG/FC circuit 21 generates a timing signal by a predetermined period and shapes a wave-form of the pattern signal 2a according to this timing signal. A signal outputted from TG/FC circuit 21 is subjected to timing correction by the timing correcting circuit 23.

The circuit 20 also includes TG/FC circuit 22 and the timing correcting circuit 24. These TG/FC circuit 22 and timing correcting circuit 24 conduct shaping the wave-form of Write/Read change-over signal 2b and correcting the timing.

Signals subjected to timing correction by the timing correcting circuits 23, 24 are inputted into the driver 25.

Signals are inputted from the timing correcting circuits 23, 24 into the driver 25, and further reference voltages are inputted into VIH input terminal 26 and VIL input terminal 29 of the driver 25. DENH signal 27a and DENL signal 28a are respectively inputted into DENH signal input terminal 27 and DENL signal input terminal 28.

In this case, DENH signal 27a is a signal for setting so that the signal level of the testing signal 20a can be "Hi" level when the device 3 to be tested is in Read Mode.

DENL signal 28a is a signal for setting so that the signal level of the testing signal 20a can be "Lo" level when the device 3 to be tested is in Read Mode. In this connection when both DENH signal 27a and DENL signal 28a are at "Lo" level, the signal level of the testing signal 20a is in a state of high impedance.

FIGS. 5A to 5D are timing chart showing a state of each signal in the test of the device 3 to be tested. In FIGS. 5A to 5D, FIG. 5A shows a pattern signal 2a, FIG. 5B shows a Write/Read change-over signal 2b, FIG. 5C shows DENH signal 27a and DENL signal 28a, and FIG. 5D shows a testing signal 20a. In this connection, "Hi" in the chart shows that the signal level of the testing signal 20a is at "Hi" level, "Lo" in the chart shows that the signal level of the testing signal 20a is at "Lo" level, and "HiZ" in the chart shows a state of high impedance.

When the test of the device 3 to be tested is started at time t1, the pattern generator 2 outputs a signal showing Write Mode as Write/Read change-over signal 2b and also outputs a test pattern as the pattern signal 2a. Accordingly, the test pattern is inputted into the device 3 to tested as the testing signal 20a. In this connection, although both DENH signal 27a and DENL signal 28a are at the level of "Lo" at this time, the testing signal 20a is not affected since Write/Read change-over signal 2b shows Write Mode.

When Write/Read change-over signal 2b is changed over to a signal showing Read Mode at time t2, an expecting pattern is outputted as the pattern signal 2a. In this connection, when both DENH signal 27a and DENL signal 28a are at the level of "Lo" at this time, the testing signal 20a is in a state of high impedance "Hiz".

When Write/Read change-over signal 2b is changed over to a signal showing Write Mode at time t3, a test pattern is outputted as the pattern signal 2a until time t4. In this period from time t3 to time t4, the state of each signal is the same as that in the period from time t1 to time t2.

In the successive period from time t4 to time t5, Write/Read change-over signal 2b shows Read Mode. Therefore, the expecting pattern is outputted as the pattern signal 2a. When one of DENH signal 27a and DENL signal 28a is at "Hi" level, the signal level of the testing signal 20a becomes a signal level corresponding to "Hi" level signal in DENH signal 27a and DENL signal 28a.

FIG. 6 is a view showing a relation between the state of each signal and the operation of the driver 25 in IC testing apparatus 100.

As shown in FIG. 6, the pattern of the testing signal 20a agrees with the pattern of the pattern signal 2a when Write/Read change-over signal 2b shows Write Mode. When Write/Read change-over signal 2b shows Read Mode, as long as both DENH signal 27a and DENL signal 28a are at "Lo" level, the testing signal 20a is in a state of high impedance. As long as one of DENH signal 27a and DENL signal 28a is at "Hi" level, the signal level of the testing signal 20abecomes a level indicated by DENH signal 27a and DENL signal 28a.

That is, in Write Mode, the signal obtained when the pattern signal 2a is corrected by the circuit 20 is outputted as the testing signal 20a. In Read Mode, the signal level of the testing signal 20a becomes a state of "Lo" level, "Hi" level or high impedance according to the state of DENH signal 27a or DENL signal 28a.

In the aforementioned conventional IC testing apparatus 100, the wave-form of the pattern signal 2a and that of Write/Read change-over signal 2b are respectively shaped by TG/FC circuits 21, 22, and timing of the pattern signal 2aand that of Write/Read change-over signal 2b are respectively corrected-by the timing correcting circuits 23, 24.

Therefore, it is necessary to match timing in a plurality of systems. However, since there are provided two circuits of TG/FC circuits 21, 22 and also there are provided two circuits of the timing correcting circuits 23, 24, it becomes complicated to adjust timing. Therefore, it is difficult to enhance the accuracy of timing of each signal.

Depending upon the content of the test of the device 3 to be tested, terminals of IC testing apparatus 100 are respectively connected with a plurality of pins of the device 3 to be tested so as to conduct the test. In this case, the circuit structure of IC testing apparatus 100 becomes complicated. Accordingly, the size of the entire testing apparatus for testing the device 3 to be tested is increased, and the efficiency is lowered and the equipment cost is increased.

SUMMARY OF THE INVENTION

The present invention has been accomplished to solve the above problems. It is an object of the present invention to conduct shaping a wave-form of a signal inputted into a device to be tested and also conduct correcting timing of the signal, by a simple circuit structure with high accuracy.

In order to solve the above problems, the invention described in aspect 1 provides an IC testing apparatus for testing a device to be tested in such a manner that a predetermined testing signal is inputted into the device to be tested so that processing is carried out according to the testing signal, comprising:

a signal output means for outputting a signal after the change-over between the testing signal and a predetermined logical level signal (for example, a logic circuit 11);

a wave-form shaping means for shaping a waveform of the signal outputted from the signal output means (for example, TG/FC circuit 12);

a correcting means for correcting an output time of the signal, the wave-form of which is shaped by the wave-form shaping means (for example, a timing correcting circuit 13);

an amplifying means for amplifying a signal outputted from the correcting means to a predetermined logical level and outputting it to the device to be tested (for example, a driver 14); and a judging means for judging the quality of the device to be tested according to the result of processing conducted in the device to be tested when the testing signal is inputted from the amplifying means into the testing device (for example, an analog comparator 4 and digital comparator 5).

According to the invention described in aspect 1, in an IC testing apparatus for testing a device to be tested in such a manner that a predetermined testing signal is inputted into the device to be tested so that processing is carried out according to the testing signal, the change-over between the testing signal and a predetermined logical level signal is conducted by the signal output means and the testing signal or the predetermined logical level signal, which has been changed over in this way, is outputted, the wave-form of a signal outputted from the signal output means is shaped by the wave-form shaping means, the output timing is corrected by the correcting means and the thus corrected timing is outputted, the signal outputted from the correcting means is amplified to a predetermined logical level by the amplifying means, the thus amplified signal is outputted to the device to be tested, and the quality of the device to be tested is judged by the judging means according to the result of processing of the device to be tested after processing has been conducted on the device according to the testing signal outputted from the amplifying means.

The invention described in aspect 5 provides an IC testing method in which a predetermined testing signal is inputted into a device to be tested and processing is carried out according to the testing signal so as to test the device to be tested, comprising the processes of:

a first process in which a signal is changed over between the testing signal and the predetermined logical level signal and outputted (for example, a process of the logical circuit 11);

a second process in which a wave-form of the signal outputted from the first process is shaped and the signal is outputted after the timing of output has been corrected (for example, a process of TG/FC circuit 12 and the timing correcting circuit 13);

a third process in which the signal outputted from the second process is amplified to a predetermined logical level and outputted to the device to be tested (for example, a process of the driver 14), and a fourth process in which the quality of the device to be tested is judged by the result of processing of the device to be tested according to the testing signal outputted from the third process (for example, a process of the analog comparator 4 and the digital comparator 5).

Accordingly, in the test in which the testing signal is inputted into the device to be tested and the device is made to conduct processing according to this testing signal so that the quality of the device to be tested can be judged according to the result of processing, while the result of processing is being outputted from the device to be tested, the signal of a predetermined logical level can be outputted to the device to be tested.

According to the present invention, the testing signal is inputted into the device to be tested, and at the same time, the signal of a predetermined logical level can be easily outputted to the device to be tested. Further, the testing signal or the signal of the predetermined logical level can be outputted after the change-over has been conducted between the testing signal and the signal of the predetermined logical level. Therefore, a series of circuits, in which the signal is amplified after the waveform form of the outputted signal has been shaped and timing has been corrected, can be realized by a simple circuit structure. Accordingly, the size of the entire IC testing apparatus can be reduced, and further the accuracy of timing correction can be enhanced.

The invention described in aspect 2 provides an IC testing apparatus according to aspect 1, further comprising a mode designating means (for example, a pattern generator 2) for designating a mode obtained after the change-over between an input mode in which the testing signal is inputted into the device to be tested and an output mode in which the result of processing is outputted from the device to be tested, wherein the signal output means outputs a signal obtained after the change-over between the testing signal and the predetermined logical level signal according to the mode designated by the mode designating means.

According to the invention described in aspect 2, the mode designating means changes over and designates between the input mode in which a testing signal is inputted into the device to be tested and the output mode in which the result of processing is outputted from the device to be tested in the IC testing apparatus described in aspect 1, and the signal output means changes over and outputs between a testing signal and a predetermined logical level signal according to the mode designated by the mode designating means.

Accordingly, since the signal change-over means changes over a signal outputted according to the designation conducted by the mode designating means, the signal can be easily changed over at more accurate timing.

The invention described in aspect 3 provides an IC testing apparatus according to aspect 2, in which the mode designating means changes over a signal between the signal for designating the input mode and the signal for designating the output mode, and the signal output means outputs the testing signal while the mode designating means is outputting a signal to designate the input mode and the signal output means outputs the predetermined logical level signal while the mode designating means is outputting a signal to designate the output mode.

According to the invention described in aspect 3, in the IC testing apparatus described in aspect 2, the mode designating means changes over and outputs between a signal to designate the input mode and a signal to designate the output mode, and the signal output means outputs a testing signal while a signal to designate the input mode by the mode designating means is being outputted, and the signal output means outputs a predetermined logical level signal while a signal to designate the output mode is being outputted.

Accordingly, while a signal to designate the input mode is being outputted by the mode designating means, a testing signal is outputted, and while a signal to designate the output mode is being outputted, a predetermined logical level signal is outputted. Therefore, the signal can be changed over by the signal change-over means when a plurality of signals are combined with each other. Accordingly, the signal change-over means can be composed of a simple logical circuit. Due to the foregoing, the size of the entire IC testing apparatus can be more decreased and further the equipment cost can be reduced. Furthermore, the accuracy of timing can be more enhanced.

The invention described in aspect 4 provides an IC testing apparatus according to aspect 1, 2 or 3, further comprising an expecting processing result output means (for example, a pattern generator 2) for outputting an expecting processing result which is a processing result in the case where the quality of the device to be tested is high, wherein the quality of the device to be tested is judged by comparing the expecting processing result outputted from the expecting processing result output means with the processing result outputted from the device to be tested.

According to the invention described in aspect 4, in the IC testing apparatus described in one of aspects 1 to 3, the expecting processing result output means outputs an expecting processing result which is a processing result in the case where the quality of the device to be tested is high, and the judging means compares the expecting processing result outputted from the expecting processing result output means with the processing result outputted from the device to be tested, so that the quality of the device to be tested can be judged.

Accordingly, the quality of the device to be tested can be easily judged when the expecting processing result and the result of processing actually outputted from the device to be tested are compared with each other. Therefore, it is possible to realize an IC testing apparatus, the circuit structure of which is simple, capable of judging the quality of a device to be tested at low equipment cost.

BRIEF DESCRIPTION OF THE DRAWINGS

FIG. 3 is a view showing a relation between the state of each signal and the operation of the driver 14 in the IC testing apparatus 1 shown in FIG. 1.

FIG. 6 is a view showing a relation between the state of each signal and the operation of the driver 25 in the IC testing apparatus shown in FIG. 4.

DETAILED DESCRIPTION OF THE PREFERRED EMBODIMENTS

Figure 1:
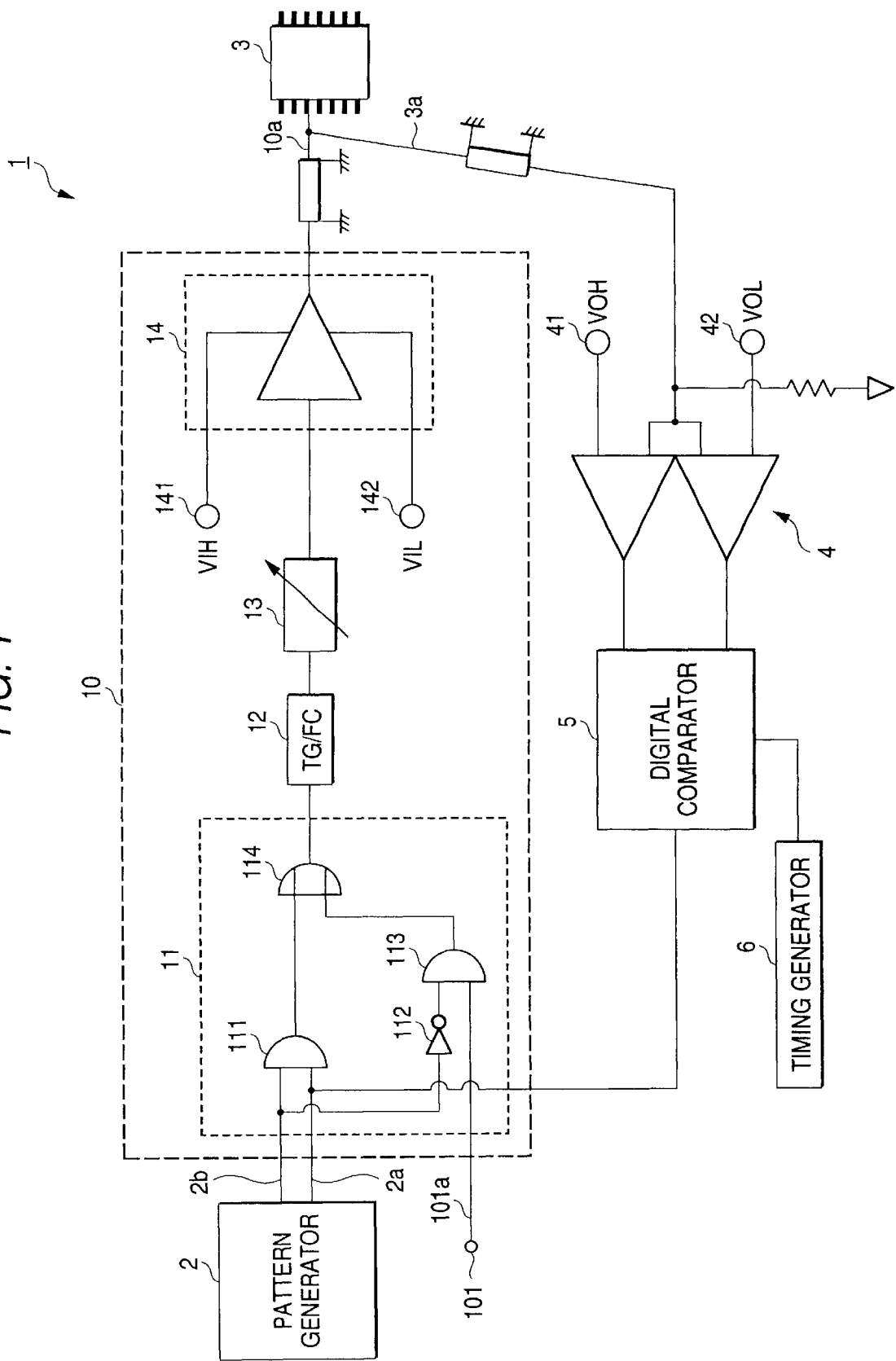
FIG. 1 is a circuit diagram showing an overall arrangement of an IC testing apparatus 1 of an embodiment of the present invention.
Figure 2:
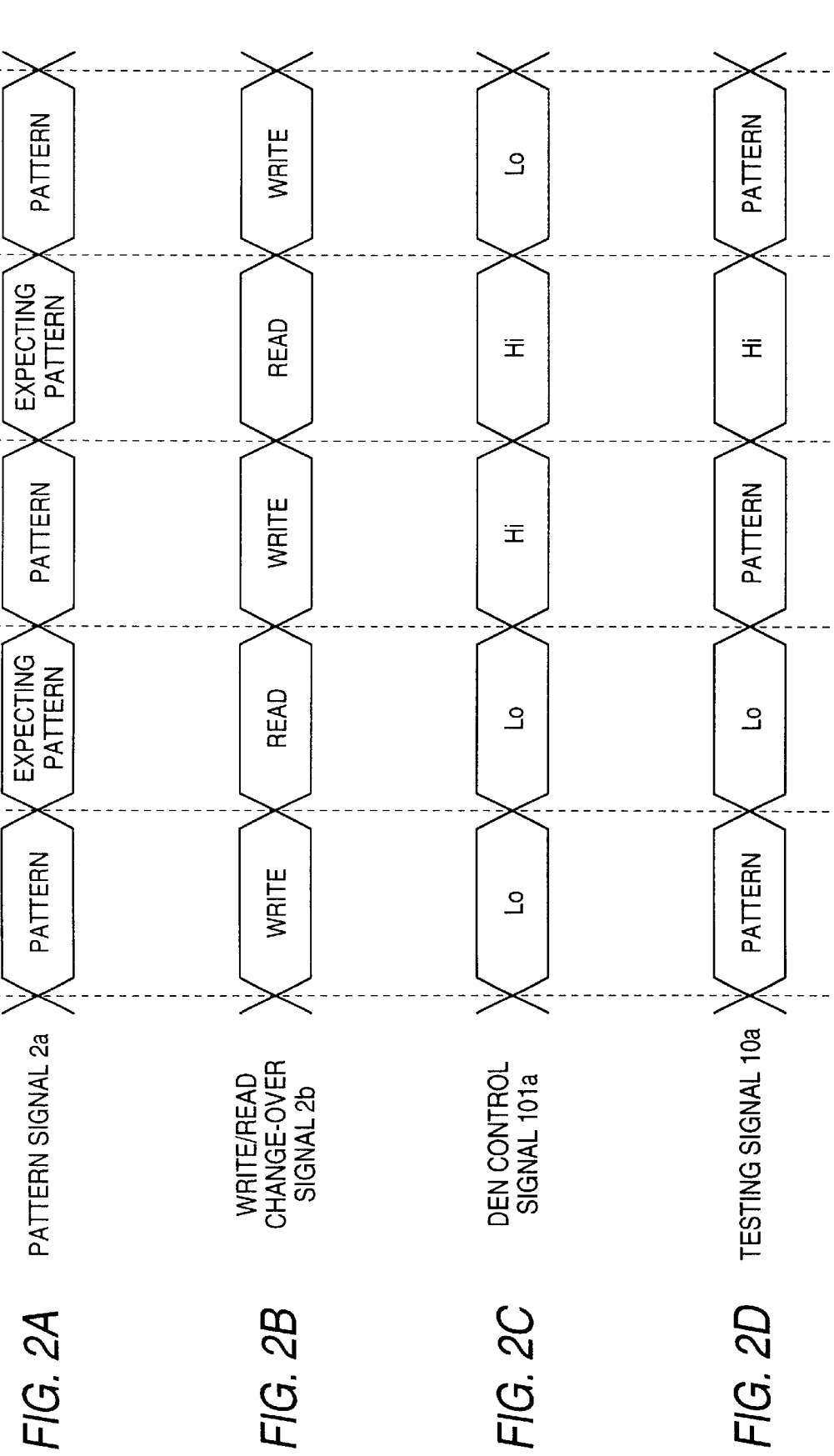
FIGS. 2A to 2D are timing chart showing a state of each signal when the device 3 to be tested is tested by the IC testing apparatus 1 shown in FIG. 1.
Figure 4:
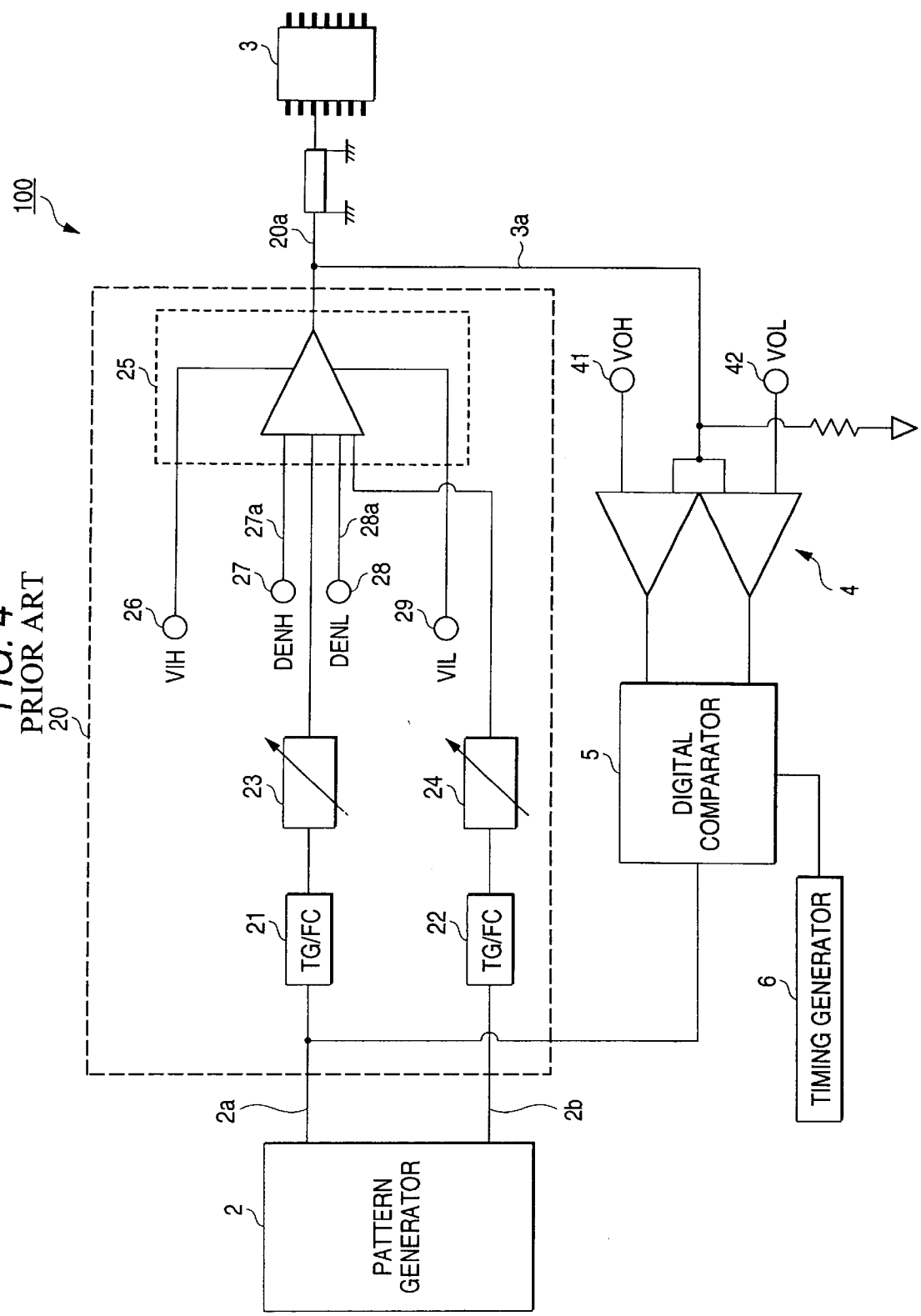
FIG. 4 is a circuit diagram showing an overall arrangement of the IC testing apparatus 100 which is an example of the conventional IC testing apparatus.
Figure 5:
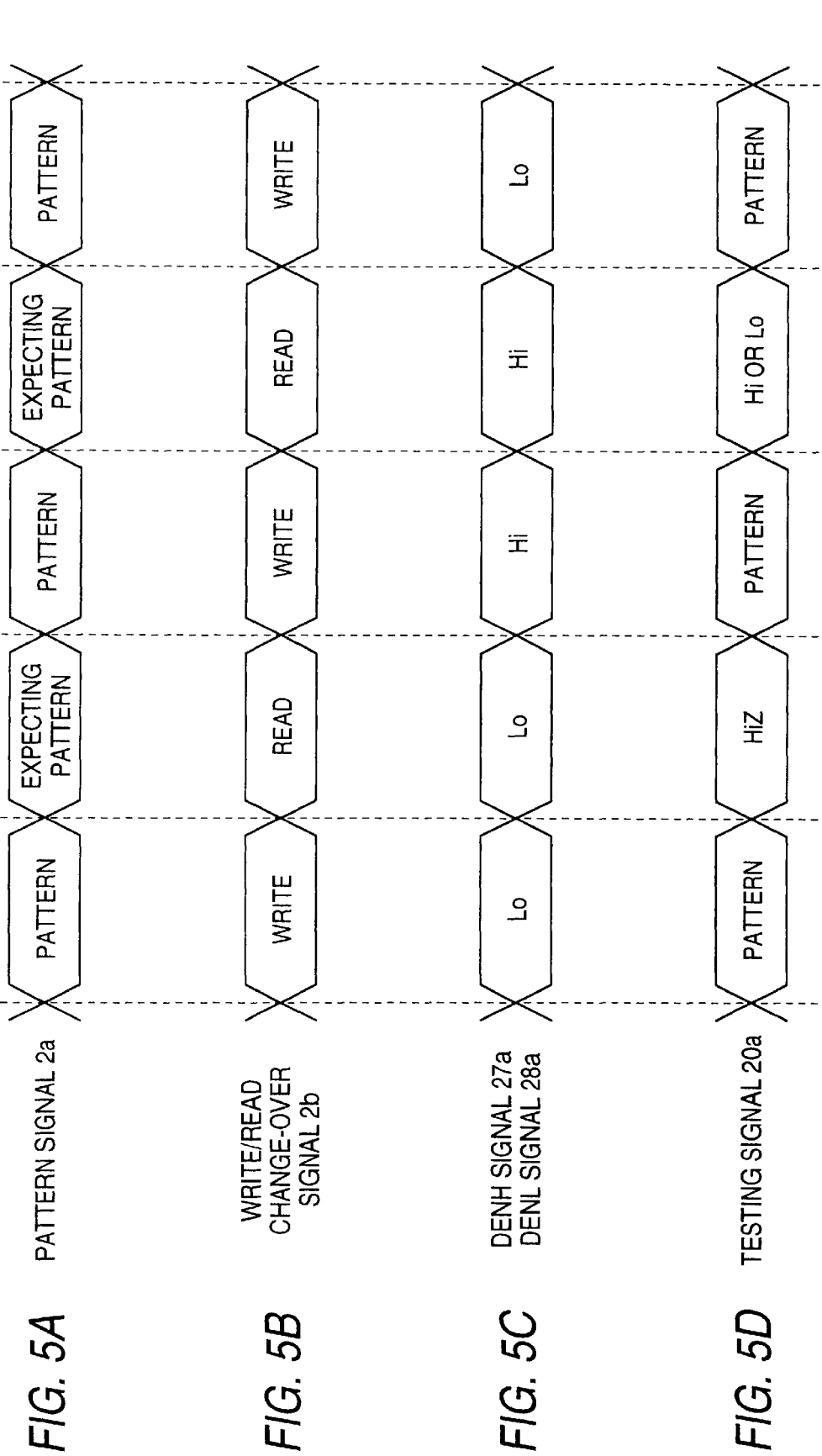
FIGS. 5A to 5D are timing chart showing a state of each signal when the test of the device 3 to be tested is carried out by the IC testing apparatus 100 shown in FIG. 4.

Referring to FIGS. 1 to 3, an embodiment of the present invention will be explained below.

FIG. 1 is a circuit diagram showing an overall arrangement of an IC testing apparatus 1 of an embodiment of the present invention. As shown in FIG. 1, this IC testing apparatus 1 conducts testing a device 3 to be tested which is incorporated into the IC testing apparatus 1. The IC testing apparatus 1 includes: a pattern generator 2, analog comparator 4, digital comparator 5, timing generator 6 and circuit 10.

In this case, the device 3 to be tested is a semiconductor device, the output type of which is an open emitter or open drain.

The circuit 10 includes: a logical circuit 11, TG/FC circuit 12, timing correcting circuit 13, and driver 14. The logical circuit 11 houses: AND gates 111, 113, inverter 112, and OR gate 114.

In this connection, the testing signal 10a is inputted into a predetermined pin of the device 3 to be tested, and the output signal 3a is outputted from the predetermined pin. Therefore, the signals are inputted and outputted via the same pin. Accordingly, while the device 3 to be tested is being tested, a state in which the testing signal 10a is inputted into the device 3 to be tested and written in the device 3 is defined as "Write Mode", and a state in which the output signal 3a is read out from the device 3 to be tested and outputted from the device 3 is defined as "Read Mode". Timing of the change-over between Write Mode and Read Mode is indicated by Write/Read change-over signal 2b described later.

First, the structure of each component of the IC testing device 1 will be explained below.

When the device 3 to be tested is tested, the pattern generator 2 generates a test pattern which is a base of processing of the device 3 to be tested. The pattern generator 2 successively outputs the test pattern 2a to the circuit 10. The thus outputted pattern signal 2a is inputted into the circuit 10 and converted into a testing signal 10a in the circuit 10. Thus obtained testing signal 10a is inputted into the device 3 to be tested.

The pattern generator 2 also generates an expecting pattern showing a result of operation of the device 3 to be tested, the quality of which is high, according to the test pattern. In order to judge the quality of the device 3 to be tested according to the output signal 3a outputted from the device 3 to be tested, the pattern generator 2 outputs the expecting pattern to the digital comparator 5 as a pattern signal 2a in the aforementioned Read Mode.

In the test of the device 3 to be tested, the pattern generator 2 creates a Write/Read change-over signal 2b for changing over between Write Mode, in which the testing signal is outputted to the device 3 to be tested, and Read Mode in which the output signal 3a is outputted from the device 3 to be tested. Thus created Write/Read change-over signal 2b is outputted to the circuit 10.

The device 3 to be tested is a semiconductor device which is an object to be tested by the IC testing apparatus 1. In Write Mode, the device 3 to be tested conducts a predetermined processing according to the testing signal 10a inputted from the circuit 10. In Read Mode, the device 3 to be tested outputs a result of processing as an output signal 3a to the analog comparator 4.

The analog comparator 4 is provided with VOH input terminal 41 and VOL input terminal 42. A reference voltage of "Hi" level is inputted into VOH input terminal 41, and a reference voltage of "Lo" level is inputted into VOL input terminal 42.

The analog comparator 4 compares the inputted reference voltage with the level of the output signal 3a which is inputted from the device 3 to be tested, and the result of comparison is outputted to the digital comparator 5.

The digital comparator 5 compares the expecting pattern, which has been outputted as a pattern signal 2a from the pattern generator 2, with the signal inputted from the analog comparator 4 according to timing created by the timing generator 6, so that the quality of the device 3 to be tested can be judged.

The timing generator 6 generates a timing signal to control operation of the digital comparator 5 and outputs it to the digital comparator 5. The pattern generator 2 changes over and outputs between the test pattern, which is he pattern signal 2a, and the expecting pattern at redetermined timing. Due to the foregoing, operation is conducted according to timing at which the expecting pattern is outputted as the pattern signal 2a, the digital comparator 5 judges the quality of the device 3 to be tested without fail.

Next, the structure of each component arranged in the circuit 10 will be explained below.

The logical circuit 11 operates as follows. While Write/Read change-over signal 2b inputted from the pattern generator 2 is showing Write Mode, the logical circuit 11 outputs the pattern signal 2a to TG/FC circuit 12. While Write/Read change-over signal 2b inputted from the pattern generator 2 is showing Read Mode, the logical circuit 11 outputs the pattern signal 2a to the digital comparator 5. The logical circuit 11 outputs DEN control signal 101a, which is inputted from the outside into DEN control signal input terminal 101, to TG/FC circuit 12.

Specifically, the logical circuit 11 operates as follows. The pattern signal 2a, which is outputted from the pattern generator 2, and Write/Read change-over signal 2b are inputted into AND gate 111 incorporated into the logical circuit 11. Only while a signal showing Write Mode is being outputted as Write/Read change-over signal 2b, AND gate 111 outputs a test pattern, which has been outputted as the pattern signal 2a, to OR gate 114. While a signal showing Read Mode is being outputted as Write/Read change-over signal 2b, AND gate 111 does not output the pattern signal 2a.

The inverter 112 inverts Write/Read change-over signal 2b outputted from the pattern generator 2 and outputs it to AND gate 113.

Write/Read change-over signal 2b inverted by the inverter 112 and DEN control signal 101a inputted into DEN control signal input terminal 101 are inputted into AND gate 113. Only while a signal showing Read Mode is being outputted as Write/Read change-over signal 2b, AND gate 113 outputs DEN control signal 101a to OR gate 114.

OR gate 114 outputs OR signal of the signal inputted from AND gate 111 and the signal inputted from AND gate 113 to TG/FC circuit 12.

When Write/Read change-over signal 2b shows Write Mode, the logical circuit 11 outputs the pattern signal 2a to TG/FC circuit 12. When Write/Read change-over signal 2bshows Read Mode, the logical circuit 11 outputs DEN control signal 101a to TG/FC circuit 12.

TG/FC circuit 12 creates a timing signal at a predetermined period and shapes a wave-form of a signal inputted from the logical circuit 12 at the created timing, and the signal, the wave-form of which has been shaped, is outputted to the timing correcting circuit 13.

The timing correcting circuit 13 conducts the correction of timing on the signal inputted from TG/FC circuit 12. After the correction of timing, the signal is outputted to the driver 14.

The driver 14 is provided with VIH input terminal 141 into which a reference voltage of "Hi" level is inputted and VIL input terminal 142 into which a reference voltage of "Lo" level is inputted. The driver 14 amplifies a signal, which has been inputted from the timing correcting circuit 13, to the level of the above reference voltage, and the thus amplified signal is outputted as a testing signal 10a.

The testing signal 10*a* outputted from the driver 14 is inputted into the device 3 to be tested in Write Mode.

The circuit 10 of the IC testing apparatus 1 is provided with DEN control signal input terminal 101, and DEN control signal 101*a* is inputted into DEN control signal input terminal 101 from the outside. DEN control signal 101*a* is a signal for designating a signal level of the testing signal 10*a* in Read Mode. When a signal level of the testing signal 10*a* is designated by this DEN control signal 101*a* in Read Mode, it becomes possible to designate the testing condition of the device 3 to be tested.

TG/FC circuit 12 in the circuit 10 conducts shaping a wave-form of the inputted signal, and the timing correcting circuit 13 in the circuit 10 conducts correcting timing, and the driver 14 amplifies an inputted signal to the inputted reference voltage. Therefore, when a signal of "Hi" level is inputted as DEN control signal 101*a*, the testing signal 10*a* can be kept at the reference voltage of the level of "Hi" inputted into the driver 14. When a signal of "Lo" level is inputted as DEN control signal 101*a*, the testing signal 10*a* can be kept at the reference voltage of the level of "Lo" inputted into the driver 14.

FIG. 2 is a timing chart showing a state of each signal when the IC testing apparatus 1 tests the device 3 to be tested. FIG. 3 is a view showing a relation between a state of each signal and operation of the driver 14 in the IC testing apparatus. Referring to FIGS. 2 and 3, operation of the IC testing apparatus will be explained below.

On the timing chart of FIGS. 2A to 2D, FIG. 2A shows a pattern signal 2*a*, FIG. 2B shows Write/Read change-over signal 2*b*, FIG. 2C shows DEN control signal 101*a*, and FIG. 2D shows a testing signal 10*a*.

At time ti when the test of the device 3 to be tested is started, a signal showing Write Mode is outputted as Write/Read change-over signal 2*b*. Then, a test pattern is outputted as the pattern signal 2*a*. On the basis of this test pattern, the testing signal 10*a* is created by the circuit 10 and inputted into the device 3 to be tested.

In this case, although DEN control signal 101*a* is a signal showing a level of "Lo", since it is in Write Mode, the signal level of the testing signal 10*a* is not affected by DEN control signal 101*a*.

Successively, at time t2, Write/Read change-over signal 2*b* is changed over to a signal showing Read Mode. Therefore, the device is set in Read Mode. Then, an expecting pattern is outputted as the pattern signal 2*a*, and a signal level of the testing signal 10*a* becomes a level of "Lo" according to DEN control signal 101*a*.

According to the above operation conducted in the period from time t1 to time t3, the device 3 to be tested is tested in Read Mode under the testing condition that the testing signal 10*a* is at the level of "Lo".

At time t3, the device is set again in Write Mode according to Write/Read change-over signal 2*b*, and a test pattern is outputted as the pattern signal 2*a*. This test pattern is outputted to the device 3 to be tested as the testing signal 10*a*. When the device is changed over to Read Mode at time t4, the testing signal 10*a* becomes the level of "Hi" according to DEN control signal 101*a*. Due to the foregoing, the test of the device 3 to be tested is carried out in Read Mode under the testing condition that the testing signal 10*a* is at the level of "Hi".

Accordingly, the test of the device 3 to be tested can be carried out in Read Mode under the two testing conditions. One is a testing condition that the level of the testing signal 10*a* is at the level of "Hi", and the other is a testing condition that the level of the testing signal 10*a* is at the level of "Lo".

FIG. 3 is a view showing a relation between DEN control signal 101*a* and operation of the driver 14, a relation between Write/Read change-over signal 2*b* and operation of the driver 14, and a relation between the pattern signal 2*a* and operation of the driver 14.

As shown in FIG. 3, when Write/Read change-over signal 2*b* shows Write Mode, the testing signal 10*a* is a signal in which the wave-form of the pattern signal 2*a* is shaped and the timing of the pattern signal 2*a* is corrected by the circuit 10. This pattern signal 2*a* is inputted into the driver 14 via AND gate 111, OR gate 114, TG/FC circuit 12 and timing correcting circuit 13. Therefore, the pattern of the testing signal 10*a* agrees with the pattern of the pattern signal 2*a*.

On the other hand, when Write/Read change-over signal shows Read Mode, the pattern signal 2*a* is not outputted from AND gate 111, and DEN control signal 101*a* outputted from AND gate 113 is inputted into the driver 14 via OR gate 114, TG/FC circuit 12 and timing correcting circuit 13. Therefore, the signal level of the testing signal 10*a*becomes the same as that designated by DEN control signal 101*a*.

As described above, the IC testing apparatus 1 of the embodiment of the present invention includes: a pattern generator 2 for outputting a pattern signal 2*a* and Write/Read change-over signal 2*b*; TG/FC circuit 12 for shaping a wave-form of the pattern signal 2*a*; a timing correcting circuit 13 for correcting timing; an analog comparator 4 for outputting a result of comparison in which an output signal 3*a* showing a result of processing obtained when the device 3 to be tested is made to carry out processing according to the testing signal 10*a* is compared with a reference voltage inputted into VOH input terminal 41 and VOL input terminal 42; and a digital comparator 5 for judging the quality of the device 3 to be tested when the result of comparison outputted from the analog comparator 4 is compared with an expecting pattern outputted as the pattern signal 2*a* according to the timing generated by the timing generator 6. In the circuit 10, there is provided a logical circuit 11. By this logical circuit 11, while Write/Read change-over signal 2*b* is showing Write Mode, the pattern signal 2*a* is outputted into TG/FC circuit 12, and while Write/Read change-over signal 2*b* is showing Read Mode, the pattern signal 2*a* is not outputted into TG/FC circuit 12, but DEN control signal 101*a* inputted into DEN control signal input terminal 101 is outputted into TG/FC circuit 12.

Due to the above structure, even if a plurality of types of signals are inputted into the driver 14, it is sufficient that TG/FC circuit 12 and the timing correcting circuit 13 are respectively provided by one, that is, it is unnecessary that TG/FC circuit 12 and the timing correcting circuit 13 are respectively provided for each signal. For the above reasons, the circuit structure of the IC testing apparatus 1 can be simplified. Therefore, the size of the IC testing apparatus 1 can be decreased and further the equipment cost can be reduced. It is unnecessary to adjust timing among a plurality of TG/FC circuits 12. Accordingly, it is possible to test the device 3 to be tested at highly accurate timing.

Further, the IC testing apparatus 1 includes one TG/FC circuit 12 and one timing correcting circuit 13, and the circuit structure of the logical circuit 11 can be relatively simplified. Therefore, even when the IC testing apparatus 1 is connected with a plurality of pins of the device 3 to be tested, the size of the entire apparatus is not so increased, and the equipment cost can be reduced.

In this connection, in the IC testing apparatus 1 of this embodiment, the reference voltage is inputted into VIH input terminal 141, VIL input terminal 142, VOH input terminal 41 and VOL input terminal 42 from the outside of the IC testing apparatus 1. However, the present invention is not limited to the above specific embodiment. It is possible to adopt a structure in which a device for outputting the reference voltage is arranged in the IC testing apparatus 1. Also, it is possible to appropriately change the detail of the structure.

According to the IC testing apparatus described in aspect 1 and the IC testing method described in aspect 5, it is easy to input a testing signal into the device to be tested and output a predetermined logical level signal, and further it is possible to change over and output between the testing signal and the predetermined logical level signal. Therefore, a series of circuits, in which a wave-form of an outputted signal is shaped and timing is corrected and then the signal is amplified, can be more simplified. Therefore, the size of the entire IC testing apparatus can be decreased and the equipment cost can be reduced, and further the accuracy of correction of timing can be enhanced.

According to the IC testing apparatus described in aspect 2 of the present invention, the signal change-over means changes over a signal outputted according to the designation conducted by the mode designation means. Therefore, the signal can be easily changed over at more accurate timing.

According to the IC testing apparatus of the invention described in aspect 3, while a signal for designating an input mode by the mode designating means is being outputted, a testing signal is outputted, and while a signal for designating an output mode is being outputted, a predetermined logical level signal is outputted. Therefore, a signal can be changed over by the signal change-over means when a plurality of signals are combined with each other. Therefore, the signal change-over means can be composed of a simple logical circuit. Due to the foregoing, the size of the entire IC testing apparatus can be more decreased and the equipment cost can be reduced. Further, the accuracy of correction of timing can be more enhanced.

According to the IC testing apparatus of the invention described in aspect 4, the quality of a device to be tested can be easily judged when an expecting processing result is compared with a processing result actually outputted from the device to be tested. Accordingly, it is possible to realize an IC testing apparatus, the circuit structure of which is simple, capable of quickly judging the quality of the device to be tested at low cost.

What is claimed is:

1. An IC testing apparatus for testing a device, said IC testing apparatus comprising:
    a generating means for generating a pattern signal and a mode signal;
    a logic means, coupled to the generating means, for outputting either the pattern signal received from the generating means or a predetermined logical level signal, based on the mode signal received from the generating means;
    a wave-form shaping means, coupled to the logic means, for shaping a waveform of the pattern signal or the predetermined logical level signal received from said logic means;
    a correcting means, coupled to the wave-from shaping means, for correcting an output time of the pattern signal or the predetermined logical level signal, shaped by said wave-form shaping means; and
    an amplifying means, coupled to the correcting means, for amplifying an output signal from said correcting means and sending the amplified output signal to said device.

2. The IC testing apparatus according to claim 1, wherein said logic means is configured to transmit the pattern signal when the mode signal designates an input mode in which the device is to receive the pattern signal, shaped, corrected and amplified, or to transmit the predetermined logical level signal when the mode signal designates an output mode in which the device is to output the result in response to the corrected and amplified pattern signal received by the device during the input mode.

3. The IC testing apparatus according to claim 1, wherein
    said generating means outputs the pattern signal while outputting the mode signal designating an input mode or outputs the predetermined logical level signal while outputting the mode signal designating an output mode; and
    said logic means selects for output the pattern signal when the input mode is received from the generating means or selects the predetermined logical level signal when the output mode is received from the generating means.

4. The IC testing apparatus according to claim 1, further comprising:
    a comparing means, coupled to the device and the generating means, for comparing a result from the device in response to said amplified signal with an expected signal generated by the generating means.

* * * * *